United States Patent [19]

Imada

[11] Patent Number: 4,797,886
[45] Date of Patent: Jan. 10, 1989

[54] MEMORY TEST PATTERN GENERATOR

[75] Inventor: Hideaki Imada, Gyoda, Japan

[73] Assignee: Advantest Corporation, Tokyo, Japan

[21] Appl. No.: 940,059

[22] Filed: Dec. 10, 1986

[30] Foreign Application Priority Data

Dec. 13, 1985 [JP] Japan ................................. 60-280653

[51] Int. Cl.$^4$ .......................................... G01R 31/28
[52] U.S. Cl. ..................................................... 371/27
[58] Field of Search ................... 371/27, 25, 21, 24,
371/10, 20; 324/73 R, 73 AT; 364/900, 200

[56] References Cited

U.S. PATENT DOCUMENTS

| | | | |
|---|---|---|---|
| 4,300,234 | 11/1981 | Maruyama | 371/27 |
| 4,460,999 | 7/1984 | Schmidt | 371/21 |
| 4,555,663 | 11/1985 | Shimizu | 371/27 |
| 4,631,724 | 12/1986 | Shimizu | 371/25 |
| 4,701,918 | 10/1987 | Nakajima | 371/27 |
| 4,701,919 | 10/1987 | Naitol | 371/27 |

Primary Examiner—Michael R. Fleming
Attorney, Agent, or Firm—Staas & Halsey

[57] ABSTRACT

A memory test pattern generator generates a memory test pattern by reading out data from a microinstruction program memory according to an instruction of an address counter and causing an address generator, a data generator and a timing generator to generate an address, data and a timing signal, respectively, according to the read-out data. To test a memory device, which has internal address generation means and is capable of address accessing by a clock signal, data representing the number of times of internal address is set in a repeat register. When a signal representing the internal address mode is read out from the microinstruction program memory, the increment of the address counter is stopped by a repeat controller, and the operation in the address and data generators is inhibited. At the same time, a timing set controller and an internal address generator are rendered operative, whereby an internal address is generated. An address multiplexer replaces predetermined bits of a fixed address generated from the address, generator with the internal address. Further, according to the internal address fixed data of the data generator is selectively passed bit by bit through a data multiplexer. Further, a timing set controller produces timing data before, during and after the internal address generation according to a timing reference signal from a repeat controller.

9 Claims, 5 Drawing Sheets

| 1 | 1A | | 1B | | 1C | 1D |
|---|---|---|---|---|---|---|
| (1) | NOP | $X \leftarrow X+1$, $Y \leftarrow Y+1$ IF CARRY X | $N \leftarrow 0,0$ | /D | TS0 |
| (2) | NOP | | $N \leftarrow N+1$ | /D | TS1 |
| (3) | NOP | | $N \leftarrow N+1$ | /D | TS1 |
| (4) | NOP | | $N \leftarrow N+1$ | /D | TS2 |

FIG. 5

| 1 | 1A | 1B | | 1C | 1D |
|---|---|---|---|---|---|
| #10 | NOP IN | $X \leftarrow X+1$, $Y \leftarrow Y+1$ IF CARRY X | $N \leftarrow N+1$ | DP | |

MEMORY TEST PATTERN GENERATOR

BACKGROUND OF THE INVENTION

This invention relates to a memory test pattern generator for generating a test pattern for a so-called nibble memory, which has internal address generating means and is capable of address accessing by merely supplying a clock signal.

A semiconductor random access memory (hereinafter referred to as RAM) is capable of random access to all the addresses. All the addresses are accessed by an externally supplied address signal.

There is one kind of RAM called nibble memory, which has internal address generating means and is capable of incrementing internal address by merely supplying a clock signal. An example of this memory is "MB81257" by Fujitsu Co., Ltd. in Japan. This memory is capable of freely accessing all the addresses in the normal mode like the ordinary memory. The nibble memory can operate in a nibble mode, i.e., internal address mode as well as in the normal mode. In the internal address mode, the following operation takes place. When the internal address mode is set with one of the addresses of the memory accessed, several, usually three, addresses following the accessed address can also be accessed by merely supplying a clock signal. The memory has a small internal address counter (address generation means) for generating internal addresses each constituted by, for example, two bits in the case of the nibble mode. The counter is incremented from a count corresponding to the last externally accessed address. A typical nibble memory has a two-bit internal counter and is capable of address increments for three addresses. It is possible to set a desired number of increments, for instance corresponding to one page, achieving a page mode. The maximum number of increments is determined by the modulo of the address counter provided in the memory. For this reason, in a broad sense, the nibble mode operation can be regarded as the internal address operation. In the internal address operation (or mode), high speed reading and writing of data can be realized compared to the case where the addresses are accessed one by one under control of an externally supplied address signal.

Figure 1:
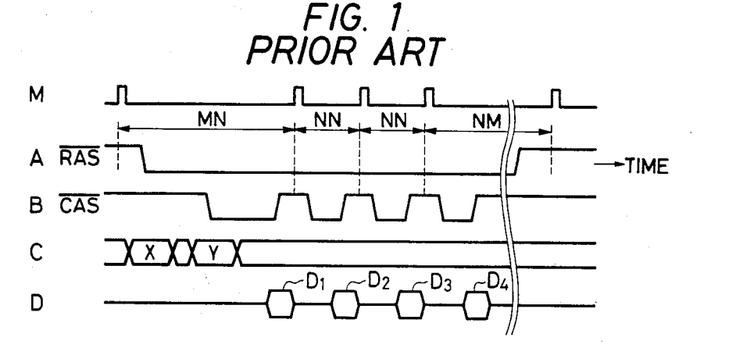
FIG. 1 is a time chart showing an example of the relationship among row and column address strobes, address and write data in an internal address mode in a prior art memory test pattern generator.

FIG. 1 shows operational waveforms illustrating the internal address mode.

A row address X (shown in row C of FIG. 1) is written in the memory with the fall of a row address strobe signal $\overline{RAS}$ (shown in row A of FIG. 1), and subsequently a column address Y (shown in row C of FIG. 1) is written in the memory with the fall of a column address strobe signal $\overline{CAS}$ (shown in row B of FIG. 1). In this way, an address of the memory is accessed. This accessing operation is the same as in the normal mode. Data D1 (as shown in row D of FIG. 1) is read out from or written in synchronization with operation clocks M in the address determined by the selected row and column addresses X and Y.

In the internal address mode, the column address strobe signal $\overline{CAS}$ is alternately and repeatedly changed to H and L levels (as shown in row B of FIG. 1) while holding the row address strobe signal $\overline{RAS}$ at L level (as shown in row A of FIG. 1). The column address strobe signal $\overline{CAS}$ at this time serves as a clock signal. The internal address counter (i.e., internal address generation means) in the memory is incremented or decremented at every fall of the signal. Thus, three addresses following the address specified by the address (X, Y) are accessed, and data D2 to D4 are read out or written in. The period MN before the start of the internal address mode, each access period NN in the internal address mode and the period NM after the end of the internal address mode are referred to as nibble-in cycle, nibble cycle and nibble-out cycle, respectively, and are related as $MN > NM > NN$.

In the operation of reading or writing data D1 in the normal mode, the strobe signals $\overline{RAS}$ and $\overline{CAS}$ are caused to fall to latch the row and column addresses and, after writing or reading data, to rise to prepare for the next access cycle in a predetermined sequence. In this case, one access operation cycle requires a time $MN + NM$. Therefore, if these data D1 to D4 are written in or read out in the normal mode, a time period of $4(MN + NM)$ is required. Thus, the speed of writing or reading data D1 to D4 in the internal address mode is higher than the speed in the normal mode.

Figure 2:
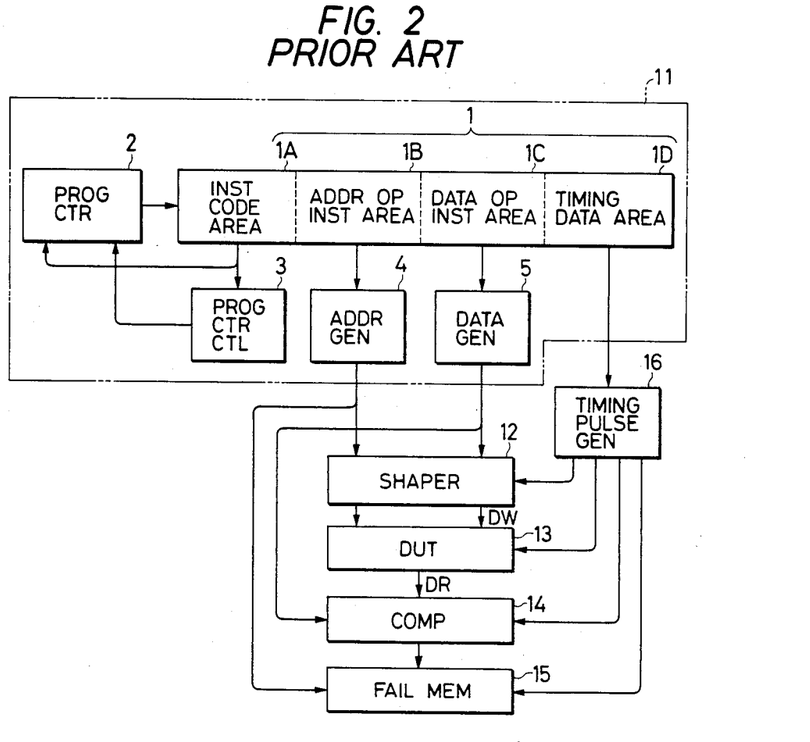
FIG. 2 is a block diagram showing the prior art memory test pattern generator for a memory with an internal address function.

The memory tester usually has a construction as shown in FIG. 2. A pattern generator 11 successively supplies test patterns to a device under test (DUT) 13 and also supplies expected value patterns DS to a comparator 14. The test patterns to be supplied to the DUT 13, i.e., addresses and, if necessary, write data DW are shaped in a shaper 12 so as to have various desired waveforms, timings and levels before being supplied to the DUT 13.

The write data DW is written in the DUT 13, and also a read data pattern DR is read out from the DUT 13 and supplied to the comparator 14. The comparator 14 checks whether the read-out data pattern DR coincides with a correct pattern, i.e., the expected value pattern DS. If the two patterns fail to coincide with each other, a signal representing failure, is written into the corresponding address of a fail memory 15. The pattern generator 11 includes a microinstruction program memory 1 having an instruction code area 1A, an address operation instruction area 1B, a data operation instruction area 1C and a timing data area 1D, all of which are simultaneously accessed with an address specified by the program counter 2. A timing pulse generator 16 receives timing data from the timing data area 1D, and according to the received timing data it produces various timing pulses for controlling the timing of advancing the program counter 2, timing of reading and writing data in and out of the DUT 13, timing of comparison operation of the comparator 14, timing of writing in the fail memory 15, etc.

The pattern generator 11 includes the program counter 2, which supplies an access address to the memory 1, a program counter controller 3, an address generator 4 and a data generator 5 in addition to the microinstruction program memory 1. When the address of the program counter 2 is supplied to the microinstruction program memory 1 so that the memory address is accessed, instructions are read out from the various areas in the program memory 1. The program counter 2 is incremented or decremented every time an instruction is read out from the program memory 1. Also, it receives a jump control by the program counter controller 3 according to an instruction code read out from the instruction code area 1A. The address generator 4 operates to generate an address pattern in accordance with an address operation instruction read out from the address operation instruction area 1B. The data generator 5 produces data patterns, i.e., the write data DW and expected value data DS, according to data operation instruction read out from the data operation instruction area 1C.

The address data and write data DW provided from the address and data generators 4 and 5, respectively, are supplied to the shaper 12 to be shaped into a selected one of various waveforms for being supplied to the DUT 13 under control of a timing signal from the timing pulse generator 16. The DUT 13 is accessed by the addresses supplied from the address generator 4 for writing and reading data under control of respective write and read pulses supplied from the timing signal generator 16. The read data pattern DR read out from the DUT 13 is supplied to the comparator 14 to be compared to the expected value pattern DS from the data generator 5. If the two compared patterns fail to coincide with each other, a signal representing the failure is written in the same address of the fail memory 15 as the address for the DUT.

The operation explained so far is the same as the usual memory test operation. Now, a test of a memory with an internal address function will be described. As mentioned before, the memory with the internal address function has an internal address generation means, which is caused to generate internal addresses by supplying a clock signal such as to cause alternate and repeated inversion of the row strobe signal $\overline{RAS}$ to H and L levels while holding an externally applied address unchanged. The internal addresses are successively substituted for predetermined bits of the externally supplied address, whereby high speed address accessing is effected without incrementing the externally supplied address.

In the tester, the same addresses as those internally generated in the DUT 13 have to be generated because it is necessary to identify the address of the DUT 13, from which data is being read out. That is, the same address as that internally generated in the DUT 13 also has to be externally generated for comparison and accessing to the fail memory 15.

Figure 3:
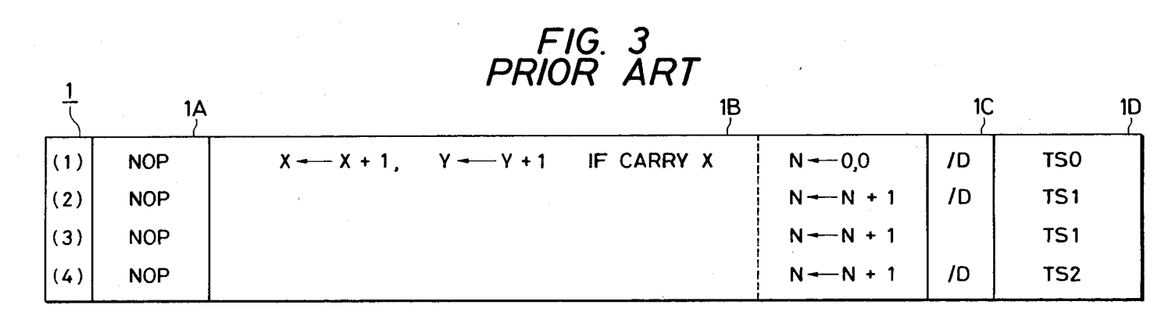
FIG. 3 is a graphical example of writing data in a microinstruction program memory of the prior art memory test pattern generator for the internal address mode.

Heretofore, operation instructions for generating the same addresses as internal addresses are written in the address operation instruction area 1B, and the same addresses as the internal addresses to be accessed are generated in the periods MN, NN and NM of the internal address mode according to the operation instructions. For example, in order to operate the DUT in a nibble mode starting with an address composed of column and row addresses X and Y, it has been necessary, in the prior art, to prepare and write in the microinstruction program memory 1 a microinstruction program as shown in FIG. 3 for the testing of the DUT 13 in the internal address mode with respect to the address (X, Y). Let it be supposed that the internal address (e.g. column address) is incremented by one, three times to produce four internal addresses, the LSB of the write data DW having been generated from the data generator 5 immediately before entering the internal address mode is "0", and new write data "1", "1", "0" and "1" are to be written in these four addresses in the mentioned order. Also, it is supposed that the timing data TS0 prior to the internal address generation, that is, the nibble-in cycle data is set to TS0=100 nsec., the timing data TS1 during each internal address generation, that is, the nibble cycle data is set to TS1=29 nsec., and the timing data TS2 subsequent to the internal address generation, that is, the nibble-out cycle data is set to TS2=50 nsec.

As shown in FIG. 3, all the instruction codes in first to fourth steps (1) to (4) in the internal address mode are NOP instructions. The address operation instruction is as follows. In the first step (1), the column address X is incremented by 1, while the row address Y is incremented by 1 only if there is a carry from X, reaching the start address of the internal address mode. The internal address N of the DUT 13 is set to an initial internal address, e.g. "0,0" which is given by predetermined bits of the start address. In each of the second to fourth steps (2) to (4), the internal address N of the DUT 13 is incremented by 1 according to the column address strobe $\overline{CAS}$ (i.e., operation clock), i.e., every time data is written in the DUT 13. While, a value N in an internal register (not shown) of the address generator 4 is set to the same value as the initial internal value "0,0", and thereafter the content of the internal register is renewed as expressed by N←N+1 in each of the steps (2) to (4). In each of the steps (1) to (4), the value N of the internal register and the start address are combined to produce an address. In this way, the same address as the internally generated address of the DUT 13 is obtained from the address generator 4 and supplied to the fail memory 15.

As mentioned before, the least significant bit of the write data immediately before entering the internal address mode is "0", and data "1", "1", "0" and "1" are to be written in the respective first to fourth steps in the internal address mode. Therefore, the instructions in the data operation instruction area 1C are as shown in column 1C in FIG. 3. Here, /D signifies that the input data is provided after being inverted. Since the immediately preceding input data is "0", operation instructions as shown in column 1C of FIG. 3 are obtained. In the first to fourth steps, respective instructions TS0 to TS2 as shown in FIG. 3 are written in the timing data area 1D, according to which timing data 100, 20, 20 and 50 nsec. are obtained in the steps (1) to (4).

In the prior art, even in the internal address mode, data is read out from the microinstruction program memory 1 for each internal address generation. This means that it is necessary to produce a microinstruction such as to obtain a desired operation for each internal address generation. This operation is comparatively time-consuming. In addition, since a microinstruction program is produced for every step, considerable time is required for the debugging, i.e., checking as to whether there is no error in the program and correcting an error if any. Further, the microinstruction program memory 1 should have a comparatively large capacity. Furthermore, the significance of the above problems is increased with increase of the steps (internal addresses) in the internal address mode.

SUMMARY OF THE INVENTION

An object of the invention is to provide a memory test pattern generator, which is capable of performing an internal address mode operation by merely writing a simple one-step microinstruction program so that it requires less microinstruction program memory capacity, and also in which a microinstruction program can be readily written and very simply debugged.

According to the invention, an internal address mode code (instruction) as a microinstruction in the internal address mode is written in an instruction code area, an address operation instruction for generating the same address as an initial internal address is written in an address operation instruction area, and if necessary an instruction for generating predetermined data is written in a data operation instruction area. Timing data is not written as any particular microinstruction program of the internal address mode, but it is generated in a timing set controller, that is, it is generated with hardware. Thus, the writing of microinstruction program is extremely simplified. In addition, the timing set controller may have a comparatively simple construction.

Further, an internal address generation repeat number is set in a repeat register. When the internal address mode code is read out from the instruction code area and supplied to a repeat controller, the repeat controller generates a release signal which is supplied to a program counter controller to release the suspension of incrementing a program counter, an inhibition signal for inhibiting the operation of the address and data generators and a timing reference signal.

The repeat controller includes a counter or the like, which counts operation clock pulses from a timing generator during the internal address mode. When the count reaches the repeat number of the repeat register, the counting operation of the counter is stopped. The inhibition signal, internal address increment control signal and timing reference signal are generated during counting by the counter from the start till a count immediately before the end count of the counter. The release signal is generated at the count immediately before the end count of the counter.

The internal address generator is controlled by the internal address increment control signal to generate the same address as the internal address generated by internal address generation means in the tested device. An address multiplexer is controlled according to the internal address mode code signal. In the absence of the internal address mode code signal, the address multiplexer passes therethrough the address from the address generator as it is. In the presence of the internal address mode code signal, the address multiplexer replaces predetermined bits of the address from the address generator with the internal address generated from the internal address generator. In this way, in the internal address mode the same address as accessed in the tested device is obtained from the address multiplexer.

A data multiplexer is controlled according to the internal address mode code signal. In the absence of the internal address mode code signal, the data multiplexer passes therethrough the data from the data generator as it is. In the presence of the internal address mode code signal, the data multiplexer selectively passes data, which has been provided immediately previously from the data generator, according to the internal address from the internal address generator. The timing set controller is controlled according to the internal address mode code signal. In the absence of the internal address mode code signal, the timing set controller directly passes therethrough timing data read out from the timing data area as it is to a timing pulse generator. When the internal address mode code signal is supplied, the timing reference data noted above is delayed, for instance. During a first disagreement period in which the delayed and non-delayed signals disagree with each other, timing data for entering internal address generation is provided. During an agreement period in which they agree with each other, timing data for executing the internal address generation is provided. During a second disagreement period, timing data for getting out the internal address generation is provided. In this way, the timing data can be formed very simply, and there is no need of writing any timing data in any internal address mode step.

DESCRIPTION OF THE PREFERRED EMBODIMENT

Figure 4:
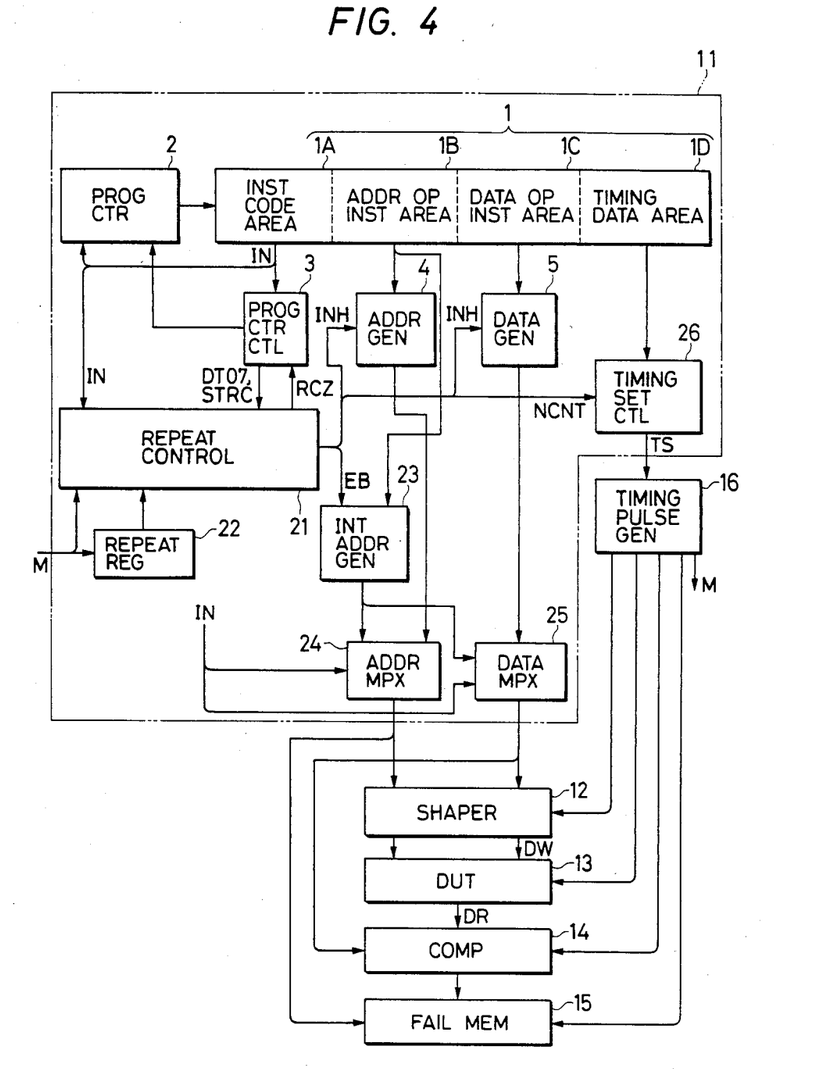
FIG. 4 is a block diagram showing an embodiment of the memory test pattern generator according to the invention.
Figure 5:
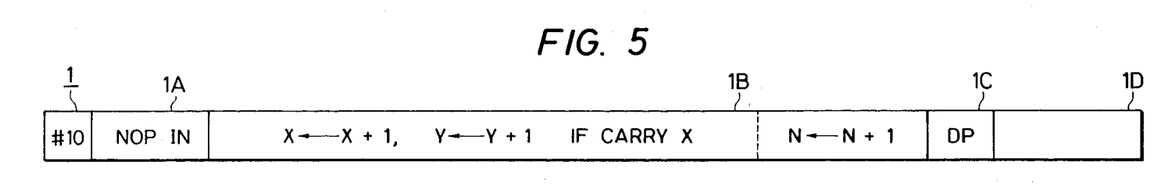
FIG. 5 is a graphical example of writing a microinstruction of the memory test pattern generator according to the invention for the internal address mode.

FIG. 4 shows an embodiment of the memory test pattern generator according to the invention. In FIG. 4, parts like those in FIG. 2 are designated by like reference numerals. According to the invention, a signal (instruction) instructing the internal address mode is stored in the instruction code area 1A. A microinstruction with respect to the internal address mode is written only in a single step as shown in FIG. 5. More specifically, a code IN="1" representing the internal address mode is written in addition to the NOP instruction in the instruction code area 1A. An operation instruction for the internal address N is written in the address operation instruction area 1B in addition to the operation instruction for the column and row addresses X and Y specifying the initial value of the internal address. The previous data immediately before entering the internal address mode may be provided as it is in the data operation instruction area 1C, or a preset fixed data DP may be written in the area 1C. In either case, the data signal includes both the write data DW and expected value data. Nothing is written in the timing data area 1D in the internal address mode.

Referring to FIG. 4, according to the invention there are provided a repeat controller 21 for controlling the repeat during the internal address mode, a repeat register 22, in which is stored the number of times internal address generation is to be repeated, an internal address generator 23 for generating the same address as an internal address of the DUT 13, an address multiplexer 24, a data multiplexer 25 and a timing set controller 26.

Figure 6:
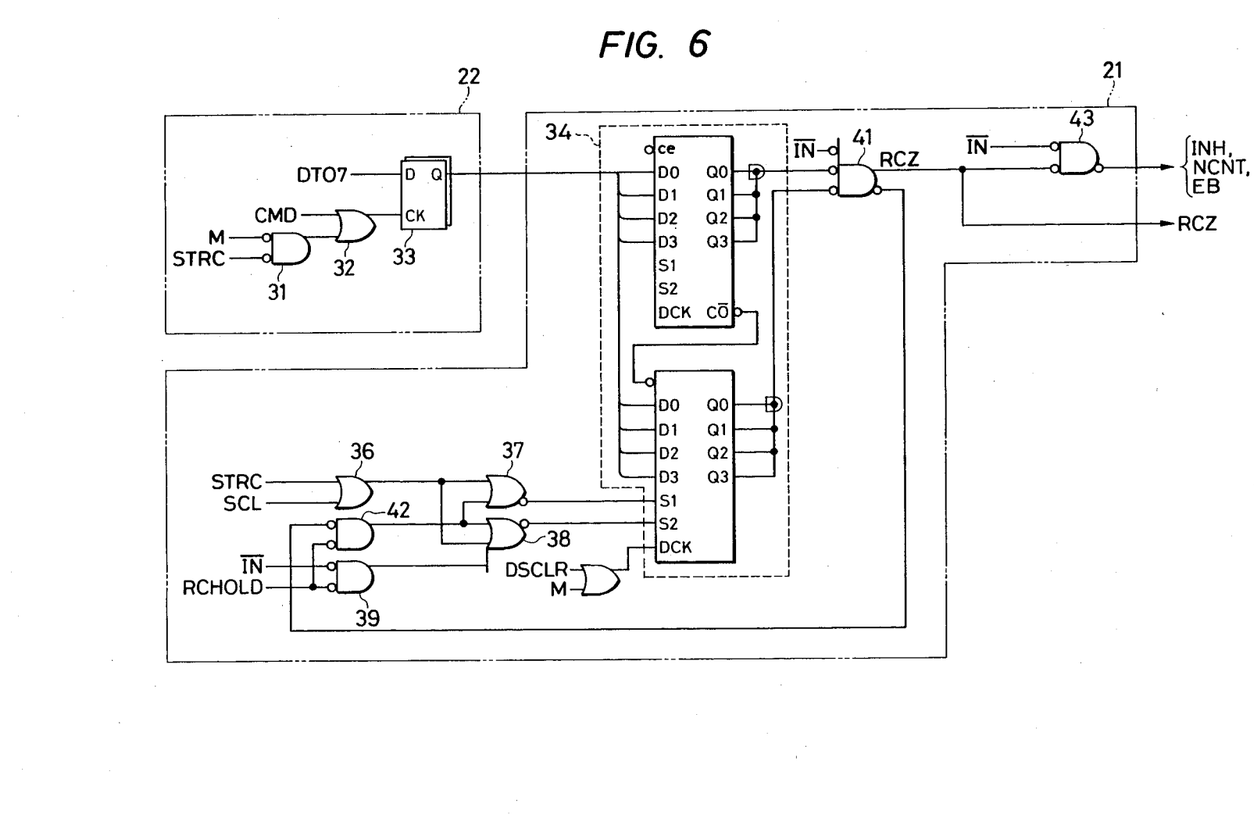
FIG. 6 is a circuit diagram showing an example of a repeat controller.

FIG. 6 shows the detailed circuit construction of the repeat controller 21 and repeat register 22. In the repeat register 22, in an initial stage of operation of the tester after the start thereof, an AND gate 31 takes an AND between a signal STRC indicating that the tester has been rendered operative (i.e., that the power switch has been turned on) and an operation clock M, and a resultant output is passed through an OR gate 32 to clock terminals CK of a plurality of D type flip-flops 33. At this time, data DT07 of plural bits which have been prevailing at data terminals D of the flip-flops 33 is set in the flip-flops 33. The data DT07 represents the number of times of internal address generation to be executed. It is possible to set the data DT07 in the flip-flops 33 according to data CMD from a control computer (not shown) through the OR gate 32 and bus.

The repeat controller 21, as shown in FIG. 6, uses a down-counter 34. When a test on the DUT 13 is started, a start clear signal SCL of "1" is supplied through an OR gate 36 to OR gates 37 and 38. Outputs "0" are thus provided from the OR gates 37 and 38 to input terminals S1 and S2 of the down-counter 34, whereby the contents of the repeat register 22 are preset in the down-counter 34. A hold command RCHOLD, which is normally "0", and a signal $\overline{IN}$, which when "1" indicates that the prevailing mode is not the internal address mode, are fed to an AND gate 39, which normally, i.e., when IN="0", provides an output "1".

Meanwhile, the bit outputs of the counter 34 are wired-ORed, and an all "0" count of the counter 34 is detected by an AND gate 41. To the AND gate 41 is also supplied the signal $\overline{IN}$. When the internal address mode is ended so that the count of the counter 34 becomes all "0", the AND gate 41 provides an output "0" at its inverted output. The inverted output of the AND gate 41 is supplied to an AND gate 42. The AND gate 42 ANDs this signal and the hold command RCHOLD to provide an output "1" when all "0" is detected by the AND gate 41. The outputs of the OR gates 37 and 38 thus both become "0" to effect presetting of the counter 34 to be ready for the next internal address mode.

Figure 7:
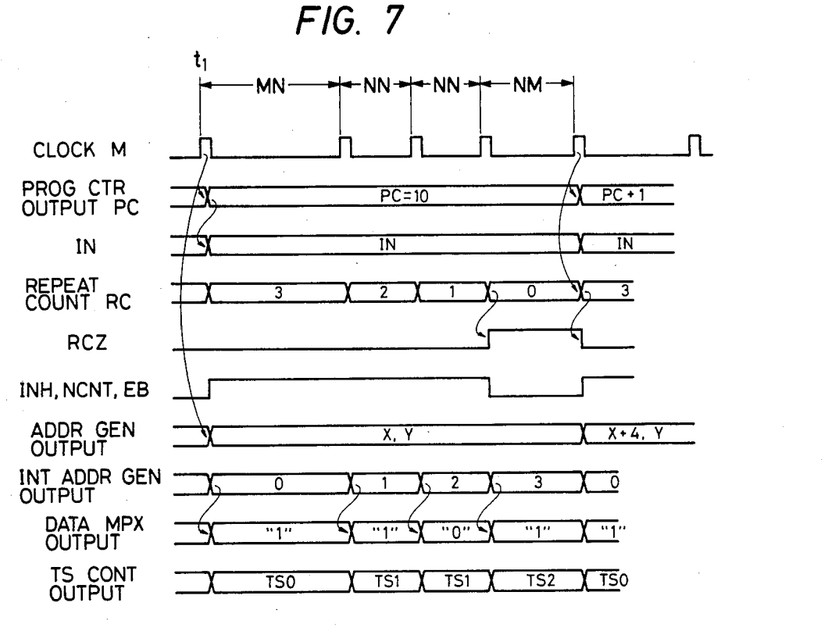
FIG. 7 is a time chart illustrating an example of control by the repeat controller shown in FIG. 6.

The non-inverted output of the AND gate 41 is supplied as control signal RCZ to the program controller 3 (FIG. 4) and to an AND gate 43. The other input of AND gate 43 receives the inverted internal address mode signal $\overline{IN}$. During the normal address mode, the program counter 2 is incremented by the operation clock signal M, shown in FIG. 7, provided from the timing pulse generator 16 shown in FIG. 4. When the count in the program counter corresponds to an address #10 of the microinstruction program memory 1 (FIG. 4) is reached at an instant $t_1$ as shown in FIG. 7, the internal address mode code IN=1 is read out. If the content of the repeat register 22 is three, the content RC of the counter 34 is preset to three. Since the signal IN is "1", the output of the AND gate 39 is "1" to premit the down counter 34 to be decremented by clock signal M. Also, the inverted output of the AND gate 43 goes to high level "1" as shown in FIG. 7 when IN becomes "1". This output from AND gate 43 produces high levels in an inhibition signal INH, a timing reference signal NCNT and an internal address increment control signal EB. Thus, the counter 34 is decremented every time an operation clock pulse M is supplied. When the next to the last internal address operation is reached, the wired-OR output of counter 34 becomes "0" and, as described above, the non-inverted output of the AND gate 41 goes to a high level, which is applied to the program counter controller 3 as a release signal RCZ to release the suspension of increment of the address counter 2. The release signal RCZ is also supplied to the AND gate 43. With the appearance of the release signal RCZ the signals INH, NCNT and EN go to low level (i.e., "0"). In other words, the inhibition signal INH, timing reference signal NCNT and internal address increment control signal EB are at high level "1" from the start of the internal address mode (i.e., when counting starts in the counter 34) until the next to the last step of the internal address mode.

As noted before, when the internal address mode instruction IN=1 is read out, the internal address mode code IN is supplied to the program counter 2 to stop the increment thereof. At the same time, the code signal IN is supplied to the address multiplexer 24. During normal address mode the address (X, Y) from the address generator 4 is provided as it is, but in the internal address mode predetermined bits of the column address X are replaced with the internal address from the internal address generator 23 as described below) in response to the signal IN=1 applied to the address multiplexer 24.

Meanwhile, with the appearance of the inhibition signal INH from the repeat controller 21 the address and data generators 4 and 5 are rendered inoperative, while only the internal address mode instruction as shown in FIG. 5 is executed. Thus, the externally supplied addresses X, Y, which constitute a reference internal address generated by the address generator 4 immediately before entering the internal address mode, are supplied from the address generator 4 to the address multiplexer 24 without being subjected to the address operation specified in the address operation instruction area 1B of the program memory 1. Further, data DP is supplied from the data generator 5 to the data multiplexer 25 without being subjected to the data operation specified in the data operation instruction area 1C of the program memory 1. When the internal address mode is not set, i.e., when IN=0, the data multiplexer 25 passes therethrough the data from the data generator 5 as modified by the data operation instruction area.

The address increment control signal EB generated at the start of the internal address mode shifts the internal address generator 23 is from the reset state into an operative state. As a result, an operation such as N←N+1 is performed, in accordance with an operation instruction in the address operation instruction area 1B, in the internal address generator 23 to increment the address in the internal address generator 23 every time an operation clock pulse M is supplied by the timing generator 16. In this example, the internal address increment produces the sequence 0, 1, 2, 3. The internal address replaces predetermined bits, e.g. the lowest two bits in the column address X of the initial (X, Y) address that is suspended in the address generator 4 since the start of the internal address mode. In the DUT 13, after the (X, Y) address has been externally specified, address increment in the internal address generation means (not shown) in the DUT 13 proceeds from the (X, Y) address under control of a signal, the column address strobe $\overline{CAS}$ in this example. Thus, the same address as the internal addresses in the DUT 13 is obtained in the external circuit from the multiplexer 24.

In the internal address mode, the internal addresses 0, 1, 2 and 3 from the internal address generator 23 are also supplied as control signals to the data multiplexer 25, and the data pattern DP, e.g., "1101", supplied from the data generator 5 in parallel, is provided bit by bit in series as write data to the DUT 13 in synchronism with the internal addresses.

Figure 8:
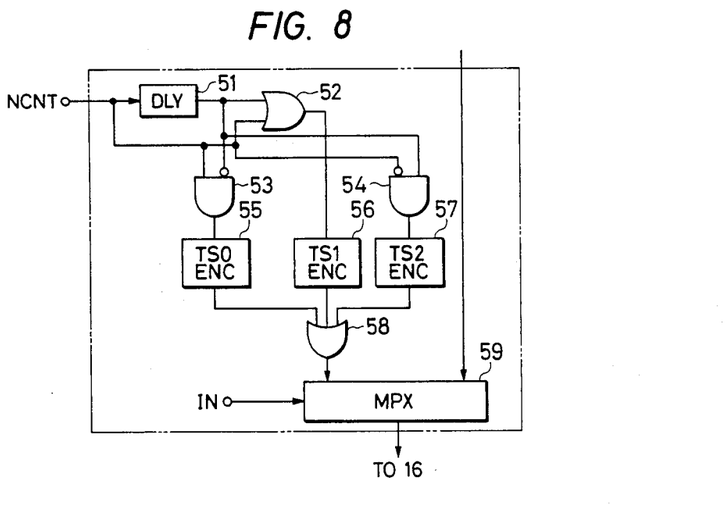
FIG. 8 is a schematic diagram showing an example of timing set controller 26.

The timing reference signal NCNT from the repeat controller 21 is supplied to the timing set controller 26. The timing set controller 26 has a construction as shown in FIG. 8. As is shown, the timing reference signal NCNT is supplied to a delay circuit 51 and AND gates 52 and 53. Also, the NCNT signal is supplied to an inverted input of an AND gate 54. The output of the delay circuit 51 is supplied to the AND gate 52, and also supplied to an inverted input of the AND gate 53. The outputs of the AND gates 53, 52 and 54 are supplied to respective encoders 55 to 57 which produce the respective timing data TS0 to TS2 as described before in connection with FIG. 3. The delay time of the delay circuit 51 is set to 100 nsec. in the above example. In this case, the periods of the data TS0 and TS2 are not equal. The data TS0, TS1 and TS2 are supplied through an OR gate 58 to the multiplexer 59. The multiplexer 59 switches the output of the OR gate 58 and timing data from the timing data area 1D according to the internal address mode code signal IN. It will be seen that the operation clock signal is generated with the appropriate timing.

In the internal address mode, an internal address is given as two bits. For example, when bits $X_7$ and $X_8$ of 9-bit column address $X_0$ to $X_8$ are "0, 0" as an initial internal address, increment of the internal address "$X_7$, $X_8$" in the DUT 13 is caused in the order of "0, 1", "1, 0" and "1, 1". The internal address generator 23 generates the same address as the internal address generated in the DUT 13 and supplies it to the address multiplexer 24. The address multiplexer 24 allots the 2-bit internal address generated from the internal address generator 23 to the bits $X_7$ and $X_8$ of the 9-bit column address $X_0$ to $X_8$ to form a complete address (X, Y), so that the complete address (X, Y) is supplied to the fail memory 15.

As explained before, the data multiplexer 25 supplies data generated from the data generator 5 bit by bit to the DUT 13 according to the internal address generated in the internal address generator 23 and provided as a control signal.

When the count of the counter 34 becomes 0, the resultant signal RCZ is supplied to the program counter controller 3 to release the hold state of the program counter 2. As a result, the normal mode of the pattern generator 11 is restored. When the signal IN representing the internal address mode is read out again in the normal mode, the program counter controller 3 renders the program counter 2 to be in the hold state, that is, the internal address mode is set again.

As has been described in the foregoing, according to the invention the signal IN representing the internal address mode (IN=1) is stored in the instruction code area 1A, and the data representing the number of times to generate an internal address is stored in the repeat register 22. Thus, the counter 34 can hold the program counter 2 and also put the address and data generators 4 and 5 in the inhibit state. Further, the timing set controller 28 generates the timing data TS0, TS1 and TS2 at the time of the internal address mode.

Thus, unlike the prior art system where all the instructions necessary for the internal address generation are read out from the microinstruction program memory 1, according to the invention an IC memory which has an internal address function can be tested without need of describing the setting of internal address data operation instructions and timing set on the microprogram for every MN, NN and NM timing data cycle but by merely writing a single step instruction with respect to the internal address mode. This writing of data is very easy, and also its debugging is very simple. It is thus possible to reduce the period of development of a program for operating the tester and also reduce the program capacity.

When more than four cycles of the internal address operation become necessary, this demand can be readily met by increasing the bit-size of each of the repeat register 22, counter 34 and internal address generator 23. Further, the counter 34 is required to count only up to the repeat number preset in the repeat register 22. It is possible to use an up-counter in lieu of the down-counter for comparison of the count to the content of the register 22.

What is claimed is:

1. A memory test pattern generator for generating a test pattern for a memory under test, the memory having internal address generating means and being capable of incrementing the internal address by merely supplying a clock signal, said memory test pattern generator comprising:

a program memory for storing instructions, each including an instruction code area for storing an instruction code and an internal address mode code, an address operation instruction area for storing an address operation instruction and an internal address operation instruction, a data operation instruction area for storing a data operation instruction, and a timing data area for storing timing data;

a program counter, operatively connected to said program memory, for producing program memory addresses in synchronization with operation clock signals to determine a program sequence, said program memory addresses being supplied to said program memory for accessing the instructions;

a program counter controller, operatively connected to said program counter and said program memory, for controlling, during a normal address mode, advancement of the program memory addresses in said program counter in accordance with the instruction code read out from the instruction code area of an accessed instruction in said program memory and for suspending, during an internal address mode, the advancement of the program memory addresses in said program counter by disregarding the instruction code when the internal address mode code indicating the internal address mode is read out from the instruction code area of the accessed instruction in said program memory;

an address generator, operatively connected to said program memory, for executing, during the normal address mode, an address operation in accordance with the address operation instruction read out from the address operation instruction area of the accessed instruction in said program memory to generate an address to be supplied to the memory under test, said address generator inhibiting the operation therein upon receipt of an inhibition signal during the internal address mode and outputting a previously produced address while the inhibition signal is received during the internal address mode;

data generating means, operatively connected to said program memory, for executing a data operation in accordance with the data operation instruction read out from the data operation instruction area of the accessed instruction in said program memory to generate one of write data and expected value data to be applied to the memory under test;

an internal address generator, operatively connected to said program memory, for executing, upon receipt of an internal address increment control signal during the internal address mode, an internal address operation in accordance with the internal address operation instruction read out from the address operation instruction area of the accessed instruction in said program memory to produce an internal address;

timing pulse generating means, operatively connected to said program memory and said program counter for generating, during the normal address mode, the operation clock signals in accordance with the timing data read out from the timing data area of the accessed instruction in said program memory and generating, during the internal address mode, the operation clock signals based on a timing reference signal applied thereto, the operation clock signals being supplied to said program counter;

repeat control means, operatively connected to said program memory, said program counter controller, said address generator, said internal address generator, and said timing pulse generating means, for generating, upon receipt of the internal address mode code from the accessed instruction in said program memory, the inhibition signal, the timing reference signal and the internal address increment control signal and for counting a predetermined number of the operation clock signals, said repeat control means producing, after counting the predetermined number of the operation clock signals, a release signal to be applied to said program counter controller for releasing the suspending of the advancement of the program memory addresses in said program counter; and an address multiplexer, operatively connected to said internal address generator and said address generator, for outputting, during the normal address mode, the addresses from said address generator and for producing, during the internal address mode, a composite address by replacing predetermined bits of the previously produced address from said address generator with respective bits of the internal address from said internal address generator, the composite address corresponding to an address accessing the memory under test in the internal address mode.

2. A memory test pattern generator according to claim 1, wherein said repeat control means comprises:

a repeat register for storing the predetermined number of the operation clock signals to be counted during the internal address mode;

a counter for counting the operating clock pulses from said timing pulse generating means;

means for starting the counting of said counter upon receipt of the internal address mode code from said program memory;

means for stopping the counting of said counter when the count thereof reaches the predetermined number in said repeat register;

signal generating means for generating the inhibition signal, the internal address increment control signal and the timing reference signal from the starting of the counting of said counter to the counting of the predetermined number minus two in said counter; and release signal means for generating the release signal at the end of the generating of the inhibition signal.

3. A memory test pattern generator according to claim 2,
wherein said counter is a down-counter, and
wherein said repeat control further comprises:
means for presetting the predetermined number stored in said repeat register into said counter at one of the start of a test and when the count of said counter becomes zero; and
means for triggering generation of the release signal from said release signal means when the count of said counter becomes zero.

4. A memory test pattern generator according to claim 1, wherein said internal address generator generates upon receipt of the internal address increment control signal from said repeat control means, the internal addresses by executing an internal address increment instruction in the address operation instruction area in the accessed instruction when the instruction code area contains the internal address mode code.

5. A memory test pattern generator according to claim 4, wherein the internal address increment control signal, the inhibition signal and the timing reference signal are generated as a single signal.

6. A memory test pattern generator according to claim 1, wherein said data generating means comprises:

a data generator, operatively connected to said program memory and said repeat control means, for executing, during the normal address mode, the data operation in accordance with the data operation instruction read out from the data operation instruction area of the accessed instruction in said program memory to generate the one of write data and expected value data to be supplied to the memory under test, the data operation of said data generator being inhibited upon receipt of the inhibiting signal from said repeat control means, and for producing unoperated data during the internal address mode, the unoperated data being identical with the one of write data and expected value data produced by said data generator immediately before entering the internal address mode; and a data multiplexer, operatively connected to said data generator and said internal address generator, for outputting, during the normal address mode, the one of write data and expected value data from said data generator and for producing an output, during the internal address mode, including at least one bit of the unoperated data as specified by the internal address from said internal address generator, the output of said data multiplexer being supplied as the one of write data and expected value data to the memory under test.

7. A memory test pattern generator according to claim 1, wherein said timing pulse generating means comprises:

a timing set controller, operatively connected to said program memory, for outputting, during the normal address mode, the timing data read out from the timing data area of the accessed instruction in said program memory and for producing, during the internal address mode, internal address timing data based on the timing reference signal; and a timing pulse generator, operatively connected to said timing set controller for generating the operation clock signals in accordance with the timing data during the normal address mode and in accordance with the internal address timing data during the internal address mode.

8. A memory test pattern generator according to claim 7, wherein said timing set controller generates, in response to the timing reference signal in said internal address mode, the internal address timing data including first timing data specifying a first period between adjacent first and second operation clock signals, the first operation clock signal beginning the internal address mode, second timing data specifying a second period between third and fourth operation clock signals in the internal address mode and third timing data specifying a third period from a fifth operation clock signal ending the internal address mode to a sixth operation clock signal beginning a subsequent mode.

9. A memory test pattern generator according to claim 8, wherein said timing set controller comprises:
   delay means for delaying the timing reference signal for the first period to produce a delayed signal;
   means for providing the first timing data during a first absence of agreement between the delayed and time reference signals;
   means for providing the second timing data during a period of agreement between the delayed and time reference signals; and
   means for providing the third timing data during a second absence of agreement between the delayed and time reference signals.

* * * * *